United States Patent [19]
Strom

[11] Patent Number: 6,066,972
[45] Date of Patent: May 23, 2000

[54] DIFFERENTIAL RECEIVER WITH DUTY CYCLE ASYMMETRY CORRECTION

[75] Inventor: James David Strom, Rochester, Minn.

[73] Assignee: International Business Machines Corporation, Armonk, N.Y.

[21] Appl. No.: 09/170,757

[22] Filed: Oct. 13, 1998

[51] Int. Cl.[7] .................................................. H03K 3/017
[52] U.S. Cl. .......................................... 327/175; 327/172
[58] Field of Search .................................... 327/175, 172, 327/176, 165

[56] References Cited

U.S. PATENT DOCUMENTS

| 4,596,954 | 6/1986 | Haque | 327/116 |
| 4,862,020 | 8/1989 | Cowan et al. | 327/172 |
| 5,053,639 | 10/1991 | Taylor | 327/155 |
| 5,491,441 | 2/1996 | Goetschel et al. | 327/291 |
| 5,920,217 | 7/1999 | Mellot | 327/175 |

FOREIGN PATENT DOCUMENTS

| 361093714A | 5/1986 | Japan | 327/175 |
| 363246025A | 10/1988 | Japan | 327/175 |

OTHER PUBLICATIONS

D. R. Cecchi et al., Paper FP 20.2 "A 1GB/S SCI Link in 0.8 μm BiCMOS," Session 20, RF/Baseband Processing, 1995 IEEE International Solid–State Circuits Conference.
S. J. Baumgartner et al., "Clock Distribution Method," *IBM Technical Disclosure Bulletin*, 32:10A (1990).
C. J. Goetschel et al., "Programmable Delay Line," *IBM Technical Disclosure Bulletin*, 37:03 (1994).
R. Gopalan et al., "High–Speed Clock System Design with the ML6500 PACMan Programmable Adaptive Clock Manager," Application Note 21 of Micro Linear Corporation, pp. 1–15 (1993).
D. Woeste et al., Paper FA 8.4 "Digital–Phase Aligner Macro for Clock Tree Compensation with 70ps Jitter," Session 8, Digital Clocks and Latches, 1996 IEEE International Solid–State Circuits Conference.
B. Wüppermann et al., Paper TP 9.1 "A 16–PSK Modulator with Phase Error Correction," Session 9, Radio Communication Circuits, 1993 IEEE International Solid–State Circuits Conference.

*Primary Examiner*—Kenneth B. Wells
*Assistant Examiner*—Hai L. Nguyen
*Attorney, Agent, or Firm*—Mark A. Hollingsworth

[57] ABSTRACT

An apparatus and method for correcting asymmetry in the duty cycle of a differential signal is disclosed. The differential receiver circuit includes a first converter including a positive input coupled to a first direct current (DC) blocking capacitor, a negative input coupled to a second DC blocking capacitor, and an output resistively coupled to the positive input of the first converter. The differential receiver circuit further includes a second converter including a positive input coupled to the negative input of the first converter, a negative input coupled to the positive input of the first converter, and an output resistively coupled to the negative input of the first converter. The respective outputs of the first and second converters are preferably inverting outputs. A differential output signal having a duty cycle of approximately 50 percent is produced between respective outputs of the first and second converters in response to a differential input signal having a duty cycle greater than or less than 50 percent. The first and second converters may be respectively implemented as low level differential-to-CMOS converters. The first and second DC blocking capacitors and resistive elements of the circuit may be implemented using field effect transistors.

22 Claims, 3 Drawing Sheets

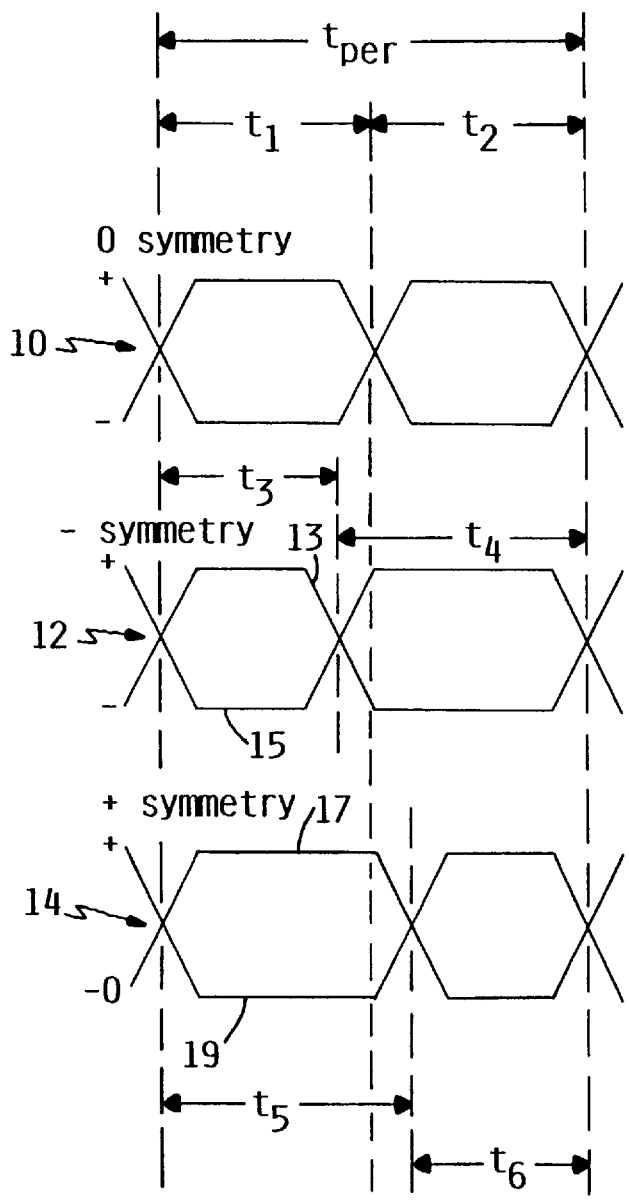
FIGURE IA
FIGURE IB
FIGURE IC

DIFFERENTIAL RECEIVER WITH DUTY CYCLE ASYMMETRY CORRECTION

FIELD OF THE INVENTION

The present invention relates generally to circuits for operating on time-varying signals and, more particularly, to a system and method for correcting asymmetry in the duty cycle of differential clock signals.

BACKGROUND OF THE INVENTION

Many integrated circuits, such as memory devices and microprocessors, for example, require a continuous clock signal having a relatively constant duty cycle of ideally 50 percent. A 50 percent duty cycle is generally considered ideal for clocking signals which allows for maximum timing flexibility within integrated circuits, such as complementary metal oxide semiconductor (CMOS) logic. It is well appreciated in the art that the symmetry of a clock signal produced by a semiconductor circuit, such as a logic circuit, shifts away from an ideal 50 percent duty cycle as a result from module, card, and board wiring mismatch, and from semiconductor process variations. The resulting asymmetry in the clock signal, which represents an appreciable deviation from an ideal 50 percent duty cycle, can result in a number of operational anomalies, including reducing the maximum frequency of operation.

A number of circuit implementations have been developed in an attempt to address duty cycle asymmetry problems associated with clock signals and other types of time-varying signals. Several disadvantages of known clock signal circuit arrangements include their complexity, the large circuit space required for implementation, and increased difficulty and expense of manufacture.

There exists a keenly felt need for an apparatus and method for correcting asymmetry in the duty cycle of an AC or time-varying signal, such as a differential clock signal. There exists a particular need for such an apparatus and method which may be implemented with minimal complexity and one that may be implemented using present and future semiconductor fabrication technologies. The present invention fulfills these and other needs.

SUMMARY OF THE INVENTION

The present invention is directed to an apparatus and method for correcting asymmetry in the duty cycle of a time-varying signal. A differential receiver circuit for correcting asymmetry in the duty cycle of a time-varying signal, such as a differential signal, includes a first converter having a positive input coupled to a first direct current (DC) blocking capacitor, a negative input coupled to a second DC blocking capacitor, and an output resistively coupled to the positive input of the first converter.

The differential receiver circuit further includes a second converter having a positive input coupled to the negative input of the first converter, a negative input coupled to the positive input of the first converter, and an output resistively coupled to the negative input of the first converter. The respective outputs of the first and second converters are preferably inverted outputs. A differential output signal having a duty cycle of approximately 50 percent is produced between respective outputs of the first and second converters in response to a differential input signal having a duty cycle greater than or less than 50 percent.

A first resistor is coupled between the output and the positive input of the first converter, and a second resistor is coupled between the output of the second converter and the negative input of the first converter. The first and second DC blocking capacitors have substantially equal values of capacitance, and the first and second resistors have substantially equal values of resistance. The respective first and second DC blocking capacitors and resistors may be implemented using field effect transistors (FET's).

In one embodiment, the first and second converters are respectively implemented as low level differential-to-CMOS converters. The first and second converters may be implemented using a CMOS technology. Alternatively, the differential receiver circuit, in its entirety, may be implemented using a CMOS technology.

A method of correcting asymmetry in the duty cycle of a differential signal according to an embodiment of the present invention involves receiving a differential input signal having a duty cycle deviating from 50 percent, removing the direct current (DC) content of the differential input signal, and adjusting a DC bias voltage provided to the differential input signal so as to adjust the duty cycle of a differential output signal to approximately 50 percent.

Adjusting the DC bias voltage provided to the differential input signal involves adjusting a zero crossing location of the differential input signal. The method may further involve converting the differential input signal from a low level differential input signal to a CMOS level differential output signal.

A deviation of the differential input signal duty cycle from 50 percent may be reduced by a factor of between approximately 2 and approximately 25 relative to a deviation of the differential output signal duty cycle from 50 percent. The differential input signal may have a duty cycle deviating from 50 percent within a range of approximately +/−150 picoseconds, and the differential output signal may have a duty cycle deviating from 50 percent within a range of approximately +/−10 picoseconds, and preferably within a range of approximately +/−6 picoseconds.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

BRIEF DESCRIPTION OF THE DRAWINGS

FIGS. 1A–1C illustrate differential waveforms for cases of perfect symmetry (FIG. 1A), negative symmetry (FIG. 1B), and positive symmetry (FIG. 1C) with respect to duty cycle;

Figures 2A, 2B, 2C:
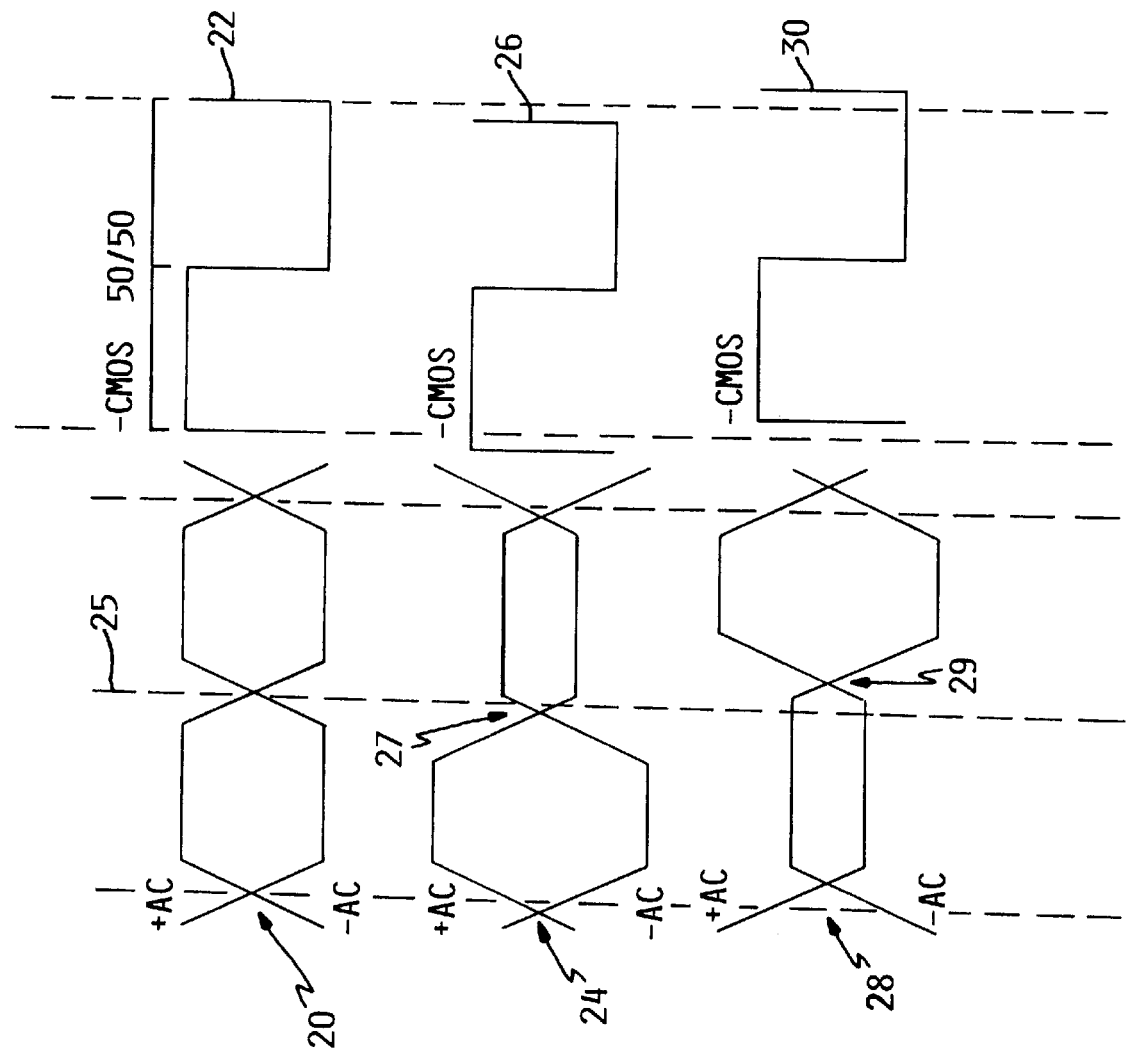
FIGS. 2A–2C illustrates respective differential input and output waveforms for cases of perfect symmetry (FIG. 2A), negative symmetry (FIG. 2B), and positive symmetry (FIG. 2C) which are subject to duty cycle symmetry correction in accordance with the principles of the present invention.

While the invention is amenable to various modifications and alternative forms, specifics thereof have been shown by way of example in the drawings and will be described in detail hereinbelow. It is to be understood, however, that the intention is not to limit the invention to the particular embodiments described. On the contrary, the invention is intended to cover all modifications, equivalents, and alternatives falling within the scope of the invention as defined by the appended claims.

DETAILED DESCRIPTION OF VARIOUS EMBODIMENTS

In the following description of illustrative embodiments, references are made to the accompanying drawings which form a part hereof, and in which is shown by way of illustration, various embodiments in which the invention may be practiced. It is to be understood that other embodiments may be utilized, and structural and functional changes may be made without departing from the scope of the present invention.

A circuit and methodology in accordance with the principles of the present invention provide for the correction of asymmetry in the duty cycle of a time-varying signal, such as a differential clock signal. A differential receiver circuit receives an input differential signal having a duty cycle deviating from 50 percent and, in response, produces an output differential signal having an approximate 50 percent duty cycle.

In a preferred mode of operation, a differential receiver circuit of the present invention adjusts the DC bias level of an AC-coupled differential input signal having a duty cycle of substantially greater than or less than 50 percent, and, in response, produces a differential output signal having of duty cycle of approximately 50 percent. The differential input signal is typically a low level differential signal and the differential output signal is typically a CMOS level signal.

Referring to the drawings, and more particularly to FIGS. 1A, 1B, and 1C, there is illustrated waveforms representing differential signals having zero or perfect symmetry, negative symmetry, and positive symmetry, respectively. The term "symmetry" or "symmetrical" as used herein in the context of "duty cycle" is intended to refer to a signal having a duty cycle of ideally or approximately 50 percent. The term "asymmetry" or "asymmetrical" as used herein in the context of "duty cycle" is intended to refer to a signal having a duty cycle that deviates appreciably from an ideal or approximate 50 percent.

In accordance with this illustrative example, each of the differential signal waveforms depicted in FIGS. 1A–1C has an equivalent period, $t_{per}$.

The duty cycle of waveform 10 shown in FIG. 1A is defined by half-cycles, $t_1$ and $t_2$, of equal duration.

As such, differential signal waveform 10 is depicted as having a 50 percent duty cycle, and therefore, perfect or zero symmetry with respect to duty cycle.

Waveform 12, shown in FIG. 1B, illustrates a differential signal having an asymmetrical duty cycle. In particular, waveform 12 is depicted as a differential signal having negative symmetry, such that a first partial cycle, $t_3$, of waveform 12, is shorter in duration than a second partial cycle, $t_4$. The asymmetry associated with differential signal waveform 14 depicted in FIG. 1C is referred to as positive symmetry, such that a first partial cycle, $t_5$, of waveform 14 is longer in duration than a second partial cycle, $t_6$, of waveform 14.

Those skilled in the art will readily appreciate that appreciable levels of asymmetry in a time-varying signal, such as a differential clock signal, can result in timing and operational anomalies within many types of circuits and systems. A specified maximum frequency of operation, for example, may be disadvantageously reduced. In high-speed and/or low-power consumption circuits, such as logic circuits implemented using a CMOS technology, for example, the duty cycle of a time-varying signal operated on by such a circuit can be unintentionally altered so as to deviate from a desired 50 percent duty cycle.

Figure 3:
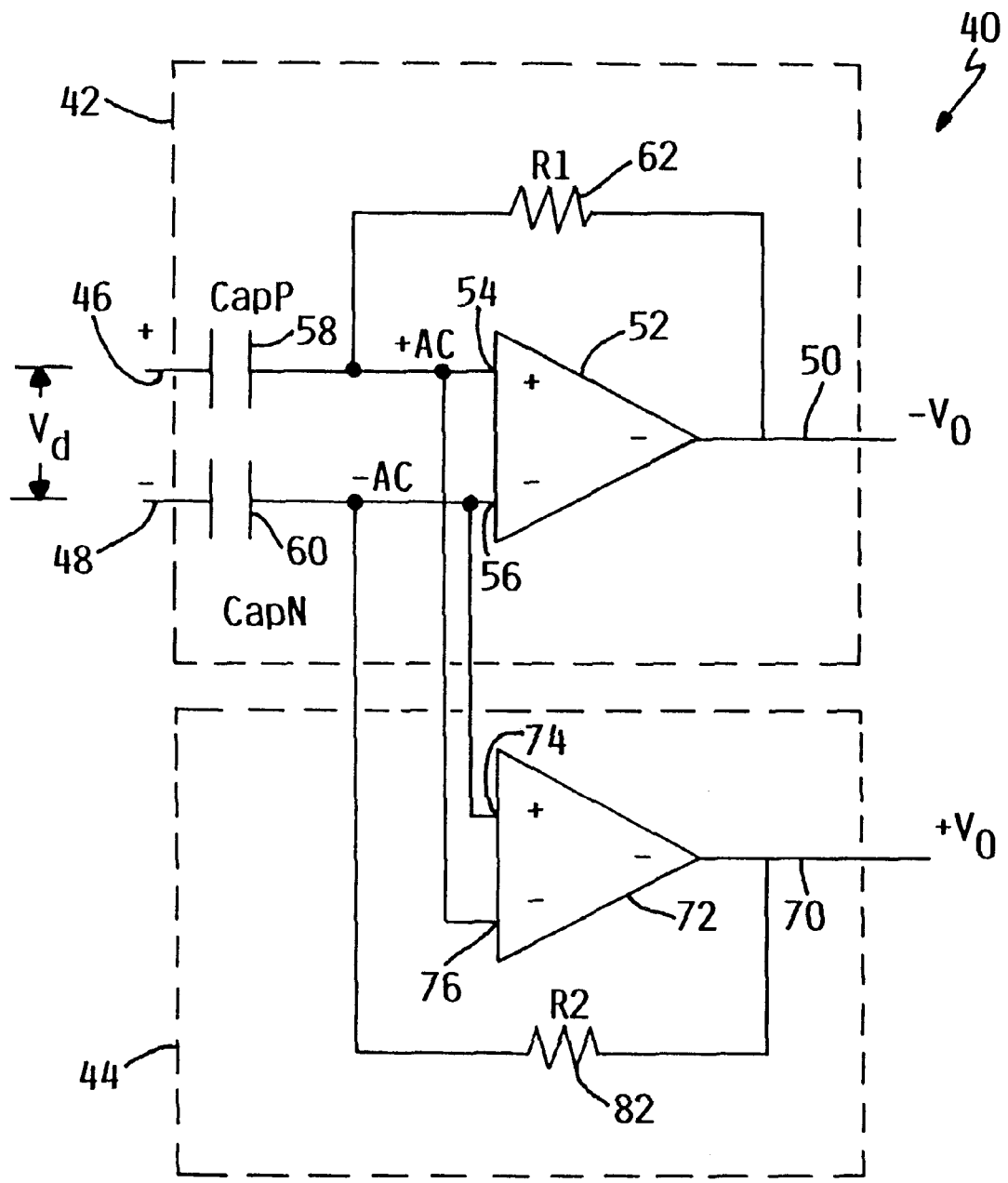
FIG. 3 illustrates in schematic form a differential receiver circuit for correcting asymmetry in the duty cycle of a differential input signal in accordance with the principles of the present invention.

An embodiment of a differential receiver circuit that advantageously corrects for duty cycle asymmetry in accordance with the principles of the present invention is depicted in schematic form in FIG. 3. In accordance with this embodiment, a differential receiver circuit 40 includes a first receiver circuit 42 and a second receiver circuit 44. The first receiver circuit 42 includes a positive input 46 and a negative input 48. Each of the inputs 46, 48 are coupled to a respective capacitor 58, 60. Capacitors 58, 60 are preferably direct current (DC) blocking capacitors having substantially equal values of capacitance.

The first receiver circuit 42 further includes a low level differential-to-CMOS converter 52. Converter 52 includes a positive input 54, a negative input 56, and an output 50. The $-V_o$ output 50 of converter 52 is preferably an inverting output with respect to positive input 54. Capacitor 58 is coupled between the positive input 46 of the first receiver circuit 42 and the positive input 54 of converter 52. Capacitor 60 is coupled between the negative input 48 of the first receiver circuit 42 and the negative input 56 of converter 52. A resistor 62 is coupled between the $-V_o$ output 50 and positive input 54 of converter 52.

The second receiver circuit 44 includes a converter 72 having a positive input 74, a negative input 76, and an output 70. The $+V_o$ output 70 of converter 72 is preferably an inverting output with respect to positive input 74. The positive input 74 of converter 72 is coupled to the negative input 56 of converter 52. The negative input 76 of converter 72 is coupled to the positive input 54 of converter 52. The $+V_o$ output 70 of converter 72 is coupled through resistor 82 to the negative input 56 of converter 52.

In general terms, converters 52 and 72 refer to devices that convert a low level differential signal to a CMOS level signal. For example, a low level differential signal may represent a differential signal having a positive amplitude of up to +1.2 V and a negative amplitude of up to −0.9 V. A low level differential signal may be represented by a positive emitter coupled logic (PECL) signal or a low voltage differential signal (LVDS) signal, for example. A CMOS level signal may represent a signal having an amplitude varying between 0 V and 1.8 V, 0 V and 2.5 V, or 0 V to 3.3 V, for example.

The differential receiver circuit 40 depicted in FIG. 3 provides for improved control of the output signal duty cycle as compared to conventional circuit arrangements. The differential receiver circuit 40 provides a differential output signal having a duty cycle approximating 50 percent when the duty cycle of the input signal deviates appreciably from 50 percent. The differential receiver circuit 40 may be employed, for example, to compensate for alterations in clock signal duty cycle resulting from mismatches in device characteristics and wiring occurring within up-stream clocking circuitry.

The differential receiver circuit 40 is particularly well-suited in applications where common mode noise causing false switching events is prevalent. Those skilled in the art will further appreciate the elegant simplicity of the differential receiver circuit 40 shown in FIG. 3, which minimizes integration complexity and costs associated with its implementation in clock circuit designs.

In general terms, the differential receiver circuit 40 represents a self-biasing circuit with respect to DC. It can be seen from FIG. 3 that capacitors 58 and 60 remove the DC content of a low level differential input signal applied between inputs 46, 48 of the first receiver circuit 42. The DC bias level of an asymmetric AC-coupled differential input signal is provided and adjusted by the first and second receiver circuits 42, 44 to produce a CMOS level output signal having a duty cycle of approximately 50 percent.

The magnitude of the DC bias level adjustment made to the AC-coupled differential input signal is dependent on the amplitude of the DC voltages respectively developed at the $-V_o$ and $+V_o$ outputs 50, 70 of converters 52 and 72. The DC voltages respectively developed at the $-V_o$ and $+V_o$ outputs 50, 70 of converters 52 and 72 are, in turn, dependent on the degree of duty cycle asymmetry present in the AC-coupled differential input signal.

The operation of the differential receiver circuit 40 depicted in FIG. 3 may be better understood with reference to the waveforms depicted in FIGS. 2A, 2B, and 2C. Waveform 20, shown in FIG. 2A, is representative of an AC-coupled differential signal developed across the positive and negative inputs 54, 56 of converter 52 in response to a low level differential input signal having perfect or zero symmetry (i.e., 50 percent duty cycle) applied to differential inputs 46, 48 of differential receiver circuit 40.

An example of such a low level differential input signal is characterized by waveform 10 shown in FIG. 1A, which may be produced from up-stream clocking circuitry and applied between positive and negative inputs 46, 48 of first receiver circuit 42. Waveform 22, depicted in FIG. 2A, represents a CMOS level output signal produced at the $-V_o$ output 50 of converter 52 in response to an AC-coupled differential input signal, such as waveform 20, developed across positive and negative inputs 54, 56 of converter 52.

In the case in which a low level differential input signal having perfect symmetry, such as waveform 10 shown in FIG. 1A, is applied between positive and negative inputs 46, 48 of the first receiver circuit 42, an AC-coupled differential signal developed across positive and negative inputs 54, 56 of converter 52, such as that represented by waveform 20 shown in FIG. 2A, demonstrates similar perfect symmetry with respect to duty cycle. It is understood that a CMOS level output signal having equivalent symmetry and amplitude characteristics to that of waveform 22, but opposite in polarity, is produced at the $+V_o$ output 70 of converter 72 in response to waveform 20 developed across differential inputs 74, 76 of converter 72.

A CMOS level output signal developed between the $-V_o$ and $+V_o$ outputs 50, 70 of converters 52, 72 likewise demonstrates perfect or zero symmetry with respect to duty cycle, as is demonstrated by the depiction of CMOS level output signal 22 of FIG. 2A developed at the $-V_o$ output 50 of the first receiver circuit 42. An AC-coupled differential signal 20 having a perfectly symmetrical 50 percent duty cycle which is applied between inputs 54, 56 of converter 52 will result in a zero net charge, or net potential difference of 0 V, with respect to the $-V_o$ output 50 and positive input 54. A zero net charge will similarly result with respect to the $+V_o$ output 70 and negative input 76 of converter 72. In this case, the DC bias level of an AC-coupled differential signal 20 having perfect symmetry is established by the differential receiver circuit 40, but does not require adjustment by the differential receiver circuit 40.

It is understood that a differential signal includes two signals of opposite polarity. For a differential signal having negative symmetry, such as waveform 12 in FIG. 1B, signal 15 of positive polarity is at a high state longer than it is at a low state. Signal 13 of negative polarity is at a low state longer than it is at a high state. It can be seen in FIG. 1C that for a differential signal having positive symmetry, such as waveform 14 in FIG. 1C, signal 19 of positive polarity is at a low state longer than it is at a high state. Signal 17 of negative polarity is at a high state longer than it is at a low state.

In the case in which a low level differential input signal having negative symmetry, such as that depicted by waveform 12 shown in FIG. 1B, is applied between positive and negative inputs 46, 48 of the first receiver circuit 42, an AC-coupled differential signal developed across positive and negative inputs 54, 56 of converter 52, such as that depicted by waveform 24 shown in FIG. 2B, exhibits an asymmetrical duty cycle. In this case, positive input 54 of converter 52 is at a high state longer that it is at a low state. Negative input 56 of converter 52 is at a low state longer than it is at a high state.

In response to differential input signal 12 having negative symmetry applied to differential inputs 46, 48, the $-V_o$ output 50 of converter 52, which is represented as an inverting output, is at a low state longer than it is at a high state. As a result, current is pulled through resistor 62 so as to pull down the DC voltage level at the positive input 54 of converter 52 until the voltage at the $-V_o$ output 50 is equal to that developed at positive input 54 during each partial cycle. The $+V_o$ output 70 of converter 72 has an equal, but opposite, effect on the negative input 56 of converter 52.

The positive and negative inputs 54 and 56 converge to a steady state DC level in response to the $-V_o$ and $+V_o$ outputs 50, 70 of converters 52, 72 reaching voltage equilibrium with respect to positive and negative inputs 54, 56. When the positive and negative inputs 54, 56 settle at the steady state DC level, an approximate 50 percent duty cycle with respect to the output CMOS level differential signal developed across the $-V_o$ and $+V_o$ outputs 50, 70 of converters 52, 72 is achieved.

The DC level of the differential signal 24 having negative symmetry is thus shifted during each partial cycle until the net charge with respect to the $-V_o$ output 50 and positive input 54 of converter 52 is zero. This shifting of the DC level of the differential signal 24 having negative symmetry can be seen in FIG. 2B as the shifting of the zero crossing location 27 with respect to dashed line 25.

CMOS level output signal 26 represents a symmetry corrected signal produced at the $-V_o$ output 50 of converter 52 in response to AC-coupled differential signal 24 having negative symmetry applied to differential inputs 46, 48 of differential receiver circuit 40. It is understood that a CMOS level output signal having equivalent corrected symmetry and amplitude characteristics to that of CMOS level output signal 26, but opposite in polarity, is produced at the $+V_o$ output 70 of converter 72 in response to waveform 24 developed across differential inputs 74, 76 of converter 72.

It will be appreciated that the above-described operation is reversed for the situation in which a waveform having positive symmetry is applied between positive and negative inputs 46, 48 of the first receiver circuit 42. In the case in which a low level differential input signal having positive symmetry, such as that depicted by waveform 14 shown in FIG. 1C, is applied between positive and negative inputs 46, 48 of the first receiver circuit 42, an AC-coupled differential signal developed across positive and negative inputs 54, 56 of converter 52, such as that depicted by waveform 28 shown in FIG. 2C, exhibits an asymmetrical duty cycle.

The DC level of the differential signal 28 having positive symmetry is shifted by the differential receiver circuit 40 during each partial cycle until the net charge with respect to the $-V_o$ output 50 and positive input 54 of converter 52 is zero. This shifting of the DC level of the differential signal 28 having positive symmetry can be seen in FIG. 2C as the shifting of the zero crossing location 29 with respect to dashed line 25. CMOS level output signal 30 represents a symmetry corrected signal produced at the $-V_o$ output 50 of converter 52 in response to AC-coupled differential signal 28 having positive symmetry applied to differential inputs 46, 48 of differential receiver circuit 40.

The differential receiver circuit 40 depicted in FIG. 3 was found, through simulation, to be highly effective in correcting for asymmetry in the duty cycle of a differential signal. In one simulation, resistors 62, 82 and capacitors 58, 60 were simulated using FET equivalent circuits in a CMOS7S technology. The values of capacitors 58, 60 and resistors 62, 82 were found suitable for this integration.

A low level differential input signal having duty cycle asymmetry of ±150 picoseconds (ps) was applied between positive and negative inputs 46, 48 of the first receiver circuit 42. A differential CMOS level output signal developed between outputs 50, 70 of converters 52, 72 in response to the low level differential input signal was found to have a greatly reduced level of duty cycle asymmetry. In particular, the ±150 ps duty cycle asymmetry in the differential input signal was reduce to approximately ±6 ps.

In other words, the differential receiver circuit 40 illustrated in FIG. 3 was found to be effective in correcting for input signal duty cycle asymmetry by a factor of approximately 25. Improvements in duty cycle symmetry by factors on the order of 2 to 25 are readily achievable using a differential receiver circuit implemented in accordance with the principles of the present invention.

The foregoing description of the various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A differential receiver circuit for correcting asymmetry in a duty cycle of a differential signal, comprising:

a first converter comprising a positive input coupled to a first direct current (DC) blocking capacitor, a negative input coupled to a second DC blocking capacitor, and an output resistively coupled to the positive input of the first converter; and a second converter comprising a positive input coupled to the negative input of the first converter, a negative input coupled to the positive input of the first converter, and an output resistively coupled to the negative input of the first converter, wherein a differential output signal having a duty cycle of approximately 50 percent is produced between respective outputs of the first and second converters in response to a differential input signal having a duty cycle greater than or less than 50 percent.

2. The circuit of claim 1, wherein the first and second DC blocking capacitors are respectively implemented using field effect transistors.

3. The circuit of claim 1, wherein the first and second DC blocking capacitors have substantially equal values of capacitance.

4. The circuit of claim 1, wherein a resistor is coupled between the output and the positive input of the first converter, and a resistor is coupled between the output of the second converter and the negative input of the first converter.

5. The circuit of claim 4, wherein each of the resistors is implemented using field effect transistors.

6. The circuit of claim 4, wherein the resistors have substantially equal values of resistance.

7. The circuit of claim 1, wherein the respective outputs of the first and second converters comprise inverting outputs.

8. The circuit of claim 1, wherein the first and second converters are respectively implemented using a complimentary metal oxide semiconductor (CMOS) technology.

9. The circuit of claim 1, wherein the first and second converters are respectively implemented as low level differential-to-CMOS converters.

10. The circuit of claim 1, wherein the differential receiver circuit is implemented using a complimentary metal oxide semiconductor (CMOS) technology.

11. The circuit of claim 1, wherein the differential input signal has a duty cycle deviating from 50 percent within a range of approximately +/−150 picoseconds, and the differential output signal has a duty cycle deviating from 50 percent within a range of approximately +/−10 picoseconds.

12. The circuit of claim 1, wherein a deviation of the differential input signal duty cycle from 50 percent is reduced by a factor of between approximately 2 and approximately 25 relative to a deviation of the differential output signal duty cycle from 50 percent.

13. A method of correcting asymmetry in a duty cycle of a differential signal, comprising:

receiving a differential input signal having a duty cycle deviating from 50 percent;

removing a direct current (DC) content of the differential input signal; and adjusting a DC bias voltage provided to the differential input signal so as to adjust the duty cycle of a differential output signal to approximately 50 percent.

14. The method of claim 13, wherein adjusting the DC bias voltage provided to the differential input signal comprises adjusting a zero crossing location of the differential input signal.

15. The method of claim 13, wherein a deviation of the differential input signal duty cycle from 50 percent is reduced by a factor of between approximately 2 and approximately 25 relative to a deviation of the differential output signal duty cycle from 50 percent.

16. The method of claim 13, wherein the differential input signal has a duty cycle deviating from 50 percent within a range of approximately +/−150 picoseconds, and the differential output signal has a duty cycle deviating from 50 percent within a range of approximately +/−10 picoseconds.

17. The method of claim 13, further comprising converting the differential input signal from a low level differential input signal to a CMOS level differential output signal.

18. A differential receiver circuit for correcting asymmetry in a duty cycle of a differential signal, comprising:

a first converter comprising a positive input coupled to a first direct current (DC) blocking capacitor, a negative input coupled to a second DC blocking capacitor, and an output resistively coupled to the positive input of the first converter, the DC blocking capacitors removing a direct current (DC) content of the differential input signal; and a second converter comprising a positive input coupled to the negative input of the first converter, a negative input coupled to the positive input of the first converter, and an output resistively coupled to the negative input of the first converter, wherein a DC bias voltage developed across respective outputs of the first and second converters in response to the differential input signal is used to adjust a duty cycle of a differential output signal developed across respective outputs of the first and second converters to approximately 50 percent.

19. The circuit of claim 18, wherein the DC bias voltage developed across respective outputs of the first and second converters adjusts a zero crossing location of the differential input signal.

20. The circuit of claim 18, wherein a deviation of the differential input signal duty cycle from 50 percent is reduced by a factor of between approximately 2 and approximately 25 relative to a deviation of the differential output signal duty cycle from 50 percent.

21. The circuit of claim 18, wherein the differential input signal has a duty cycle deviating from 50 percent within a range of approximately +/−150 picoseconds, and the differential output signal has a duty cycle deviating from 50 percent within a range of approximately +/−10 picoseconds.

22. The circuit of claim 18, wherein the first and second converters convert the differential input signal from a low level differential input signal to a CMOS level differential output signal.

* * * * *